United States Patent [19]

Ohmae et al.

[11] Patent Number: 5,264,746
[45] Date of Patent: Nov. 23, 1993

[54] LOGIC CIRCUIT BOARD WITH A CLOCK OBSERVATION CIRCUIT

[75] Inventors: Ken-ichi Ohmae; Hitoshi Ishizuki, both of Tokyo, Japan

[73] Assignee: NEC Corporation, Tokyo, Japan

[21] Appl. No.: 883,383

[22] Filed: May 15, 1992

[30] Foreign Application Priority Data

May 16, 1991 [JP] Japan .................................. 3-141123
May 16, 1991 [JP] Japan .................................. 3-141124

[51] Int. Cl.⁵ ........................ H03K 19/00; G06K 5/04
[52] U.S. Cl. .............................. 307/480; 371/1; 307/269; 307/262
[58] Field of Search ............... 307/443, 440, 303.2, 307/269, 263, 606, 591; 371/1; 328/63, 155

[56] References Cited

U.S. PATENT DOCUMENTS

| | | | |
|---|---|---|---|
| 4,812,684 | 3/1989 | Yamagiwa et al. | 307/480 |
| 4,860,288 | 8/1989 | Teske et al. | 371/1 |
| 5,003,256 | 3/1991 | Merrill | 371/1 |
| 5,122,679 | 6/1992 | Ishii et al. | 307/269 |
| 5,140,184 | 8/1992 | Mamamoto et al. | 371/1 |

*Primary Examiner*—Edward P. Westin
*Assistant Examiner*—Andrew Sanders
*Attorney, Agent, or Firm*—Foley & Lardner

[57] ABSTRACT

This logic circuit board with a clock observation circuit comprises a plurality of logic circuit IC chips and a clock supply IC chip to supply clock signal to such logic circuit IC chips mounted on a printed wiring board. The logic circuit IC chips are respectively connected to the clock supply IC chip via clock supply wires to propagate clock signal, all of which have the same length. Each of the logic circuit IC chips is provided with an observation terminal for clock signal observation, and the clock supply IC chip is provided with an external terminal for clock signal observation. Propagation time adjustment means comprising a delay circuit for adjustment of clock signal propagation time is provided between the clock supply IC chip and the external terminal. Then, the delay in propagation of clock signal is adjusted so that the phase shift of the clock signal observed at the external terminal is the central shift value between the maximum and the minimum shifts of the clock signal observed at the observation terminals of the logic circuit IC chips.

7 Claims, 7 Drawing Sheets

LOGIC CIRCUIT BOARD WITH A CLOCK OBSERVATION CIRCUIT

BACKGROUNDS OF THE INVENTION

1. FIELD OF THE INVENTION

This invention relates to a logic circuit board provided with a clock observation circuit, and particularly relates to a logic circuit board enabling minimization of clock skew in an electronic device comprising a plurality of logic circuit boards.

2. DESCRIPTION OF THE PRIOR ART

Suppose a circuit device is provided with many logic circuit boards comprising a plurality of logic circuit IC chips and a clock supply IC chip to supply clock signal to such logic circuit IC chips mounted on a single printed wiring board. When such a logic circuit device is operated, it is required to observe clock skew at every logic circuit board and decide the clock cycle for the whole circuit device corresponding to the largest clock skew.

Conventionally, a logic circuit board of this kind is provided with an external terminal for observation from an IC chip at a typical location on a logic circuit board, and the output from such a terminal is used for clock observation. Alternatively, a clock supply IC chip is designed to have a wiring pattern of a certain length and the output from such pattern to the external observation terminal on the border of a printed wiring board is used for observation.

In such a conventional clock observation circuit as described above, since the clock is observed at an external observation terminal connected with an IC chip at a typical location or an external terminal connected with a clock supply IC chip, there is only a little likelihood that the point of clock observation (clock phase) for adjustment represents the true central value of the phase shifts at a plurality of IC chips receiving the clock on the logic circuit board. As a result, a circuit device consisting of many logic circuit boards is accompanied by a large amount of clock skew, which is difference in clock shifts among the logic circuit boards. Therefore, for a circuit device consisting of many logic circuit boards, it is necessary to prolong the whole clock cycle to cope with increase in clock skew among the logic circuit boards, which may lead to deterioration in device performance.

SUMMARY OF THE INVENTION

An object of the present invention is to provide a logic circuit board to prevent deterioration in performance of a whole circuit device comprising a plurality of logic circuit boards by minimizing the clock skew at the logic circuit boards.

According to a preferred embodiment of the present invention to attain this object, a logic circuit board with a clock observation circuit comprises a plurality of logic circuit IC chips and a clock supply IC chip to supply clock signal to such logic circuit IC chips mounted on a printed wiring board. The clock supply IC chip is connected with the logic circuit IC chips via clock supply wires which have the same length and are capable of propagating the clock signal. The logic circuit IC chips are respectively provided with an observation terminal for clock signal observation and the clock supply IC chip is provided with an external terminal for clock signal observation. Further, propagation time adjustment means is provided between the clock supply IC chip and the external terminal.

According to another preferred embodiment, the external terminal is disposed on the border of the printed wiring board. More preferably, the propagation time adjustment means adjusts the delay in propagation time for clock signal so that the phase shift of the clock signal observed at the external terminal is identical to the central value of the maximum and the minimum phase shifts in the clock signal observed at the observation terminals of the logic circuit IC chips.

According to a further preferred embodiment, the propagation time adjustment means comprises a delay circuit using a coil.

According to still another preferred embodiment of the present invention, a logic circuit board with a clock observation circuit comprises a plurality of logic circuit IC chips and a clock supply IC chip to supply clock signal to such logic circuit IC chips mounted on a printed wiring board. This clock supply IC chip is connected with the logic circuit IC chips via clock supply wires which have the same length and are capable of propagating the clock signal. The logic circuit IC chips are respectively provided with an observation terminal for observation of clock signal supplied to the logic circuit IC chip. The logic circuit IC chips and the corresponding observation terminals are connected via wires having the same length. The printed wiring board is further provided on its border with an external terminal for clock signal observation and in the vicinity of the observation terminals with a relay terminal which is connected via wiring with the external terminal and either of the observation terminals.

According to a preferred embodiment, the observation terminals are closely disposed in the vicinity of the relay terminal. More preferably, an observation terminal having a phase shift closest to the central value between the maximum and the minimum shifts of the clock signals observed at the observation terminals is selected and the selected observation terminal is connected with the relay terminal.

Other objects, characteristics and effects of the present invention will be clarified in the detailed description below.

DESCRIPTION OF THE PREFERRED EMBODIMENT

Figure 1:
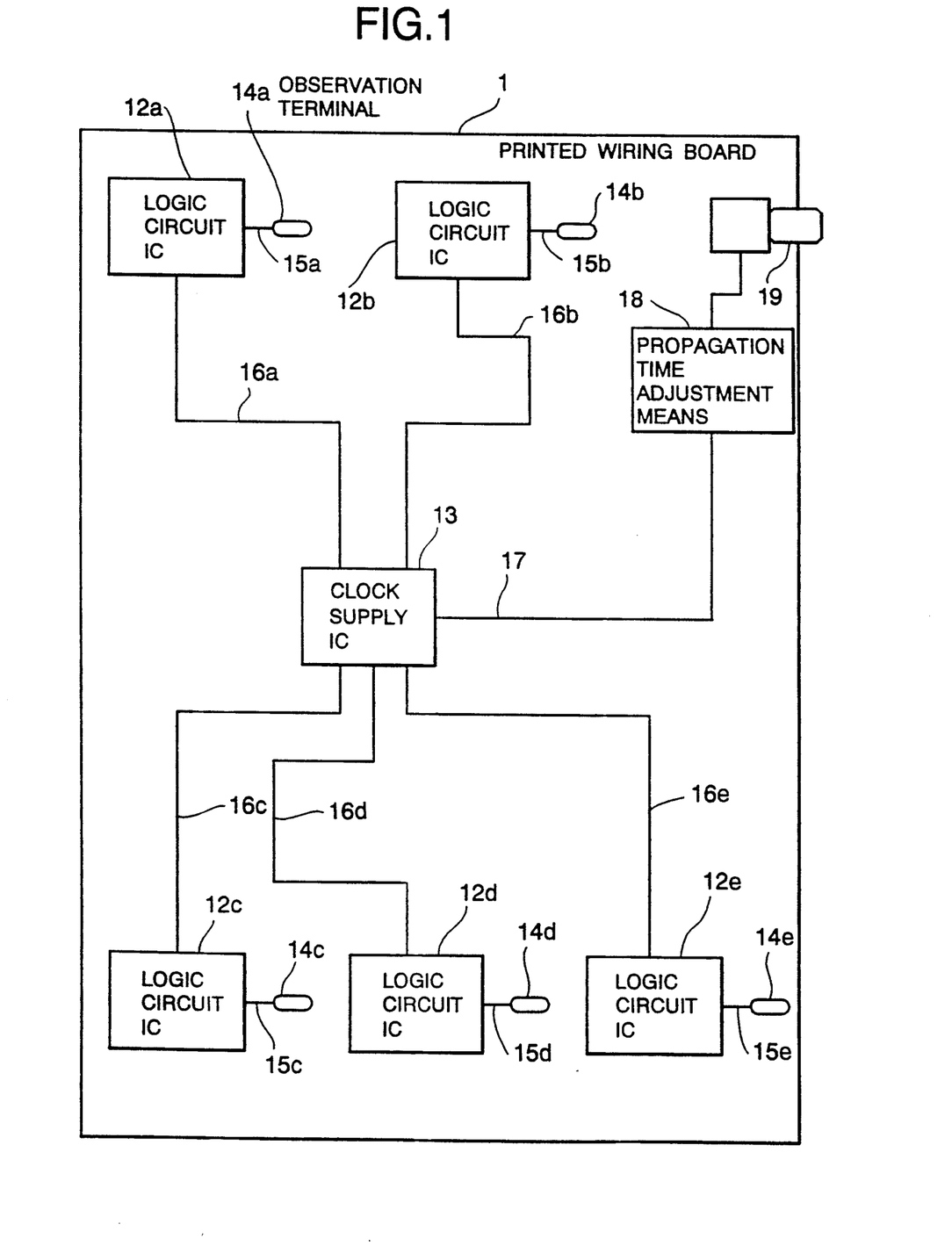
FIG. 1 is a schematic diagram to show the configuration of a logic circuit board provided with a clock observation circuit according to a first embodiment of the present invention.

Referring to FIGS. 1 to 4, preferred embodiments of the present invention is described below. FIG. 1 shows the configuration of a logic circuit board having clock observation function according to a first embodiment of the present invention. In FIG. 1, the logic circuit board having clock observation function of this embodiment comprises a printed wiring board 1, a plurality of logic circuit IC chips 12A to 12E mounted thereon, and a clock supply IC chip 13 to supply clock signal to these logic circuit IC chips 12A to 12E also mounted on the printed wiring board 1. The clock supply IC chip 13 is disposed almost at the center of the printed circuit board 1 and the logic circuit IC chips 12A to 12E are disposed around the clock supply chip 13.

The logic circuit IC chips 12A to 12E receiving clock from the clock supply IC chip 13 are connected with the clock supply IC chip 13 via clock supply wires 16A to 16E, all of which have the same length. The clock supply wires 16A to 16E are designed to have the same length so that the clock signal is propagated in the same period of time from the clock supply IC chip 13 to any of the logic circuit IC chips 12A to 12E.

In the vicinity of the logic circuit IC chips 12A to 12E of the logic circuit board, observation terminals 14A to 14E for observation of supplied clock signal are provided. The observation terminals 14A to 14E are respectively connected with the logic circuit IC chips 12A to 12E via wires 15A to 15E.

The printed wiring board 1 is provided on its border with an external terminal 19 for observation of the clock signal sent from the clock supply IC chip 13. The external terminal 19 comprises a coaxial connector and is connected with the clock supply IC chip 13 via a wire 17. Between the clock supply IC chip 13 and the external terminal 19, propagation time adjustment means 18 to adjust the time for clock signal propagation is provided.

Figure 2:
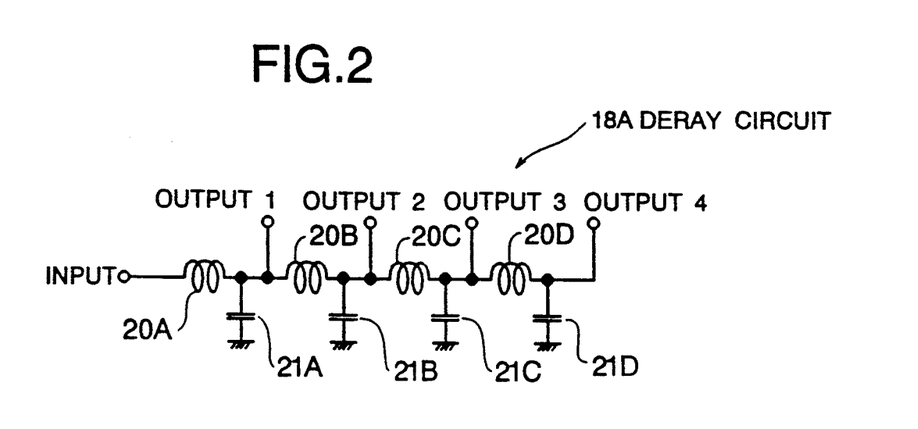
FIG. 2 is a schematic diagram to show a first circuit for the propagation time adjustment means in a logic circuit board according to a first embodiment.
Figure 3:
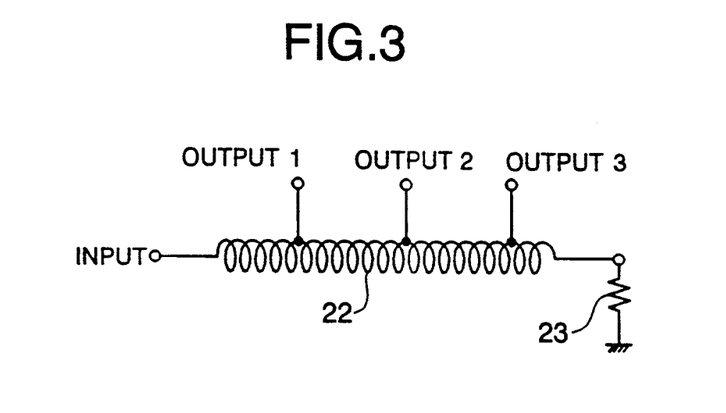
FIG. 3 is a schematic diagram to show a second circuit for the propagation time adjustment means.
Figure 4:
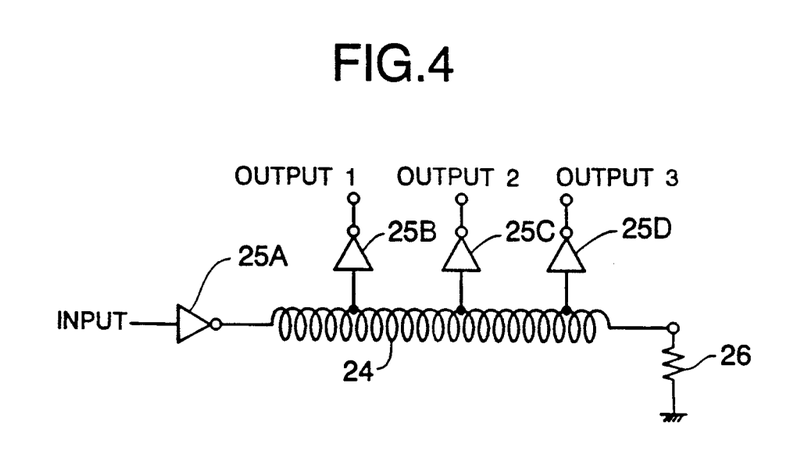
FIG. 4 is a schematic diagram to show a third circuit for the propagation time adjustment means.

This propagation time adjustment means 18 may comprise, as shown in FIG. 2, a delay circuit 18A provided with coils 20A to 20D and capacitors 21A to 21D. This delay circuit 18A has four outputs 1 to 4 for different delays in propagation time, and the delay in propagation time can be changed by selecting either of these outputs 1 to 4. Alternatively, the propagation time adjustment means 18 may consist of a coil 22 and a terminating resistor 23 as shown in FIG. 3. In this case, three outputs 1 to 3 are available. The delay in propagation time can be changed by selecting either of these outputs 1 to 3. In FIG. 4, the propagation time adjustment means 18 comprises a coil 24, NOT gates 25A to 25D of a plurality of logic circuits and a terminating resistor 26, and the output from either of the NOT gates 25B to 25D can be selected as the output 1, 2 or 3. For example, if the clock signal is at a high speed, a proper waveform may not be obtained with the circuit as in FIG. 2 or e. A solution to such a case is the use of a circuit using NOT gates 25B to 25D as shown in FIG. 4, which properly shapes the waveform of propagated clock signal.

The propagation time adjustment means 18 may not be limited to the examples above; it may also be constituted with line devices with patterns having a certain length folded for a number of times for a certain delay time.

Here, the delay in propagation time from the clock supply IC 13 set at the propagation time adjustment means 18 is arranged so that the propagation delay time for the observation terminals 14A to 14E of the logic circuit IC chips 12A to 12E receiving supplied clock signal is almost the same as that for the external terminal 19.

Next, the operation for adjusting the clock signal for the logic circuit board above is described.

Figure 5:
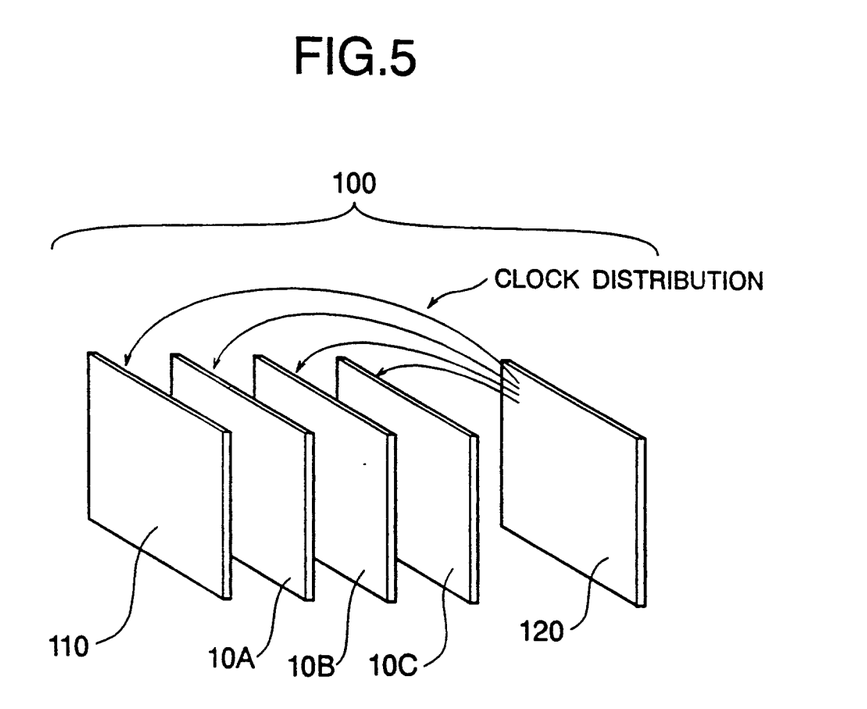
FIG. 5 is a diagram to show mounting of logic circuit boards onto a logic circuit device.

As shown in FIG. 5, suppose the logic circuit device comprises a plurality of logic circuit boards as above. This logic circuit device 100 is in advance provided with a reference logic circuit board 110, which has the same configuration as the logic circuit board according to this embodiment. This reference logic circuit board 110 is given a certain clock phase. In addition, the device is provided with a clock supply board 120 so as to distribute clock signal to the wiring boards 110, 10A, 10B and 10C.

Figure 6:
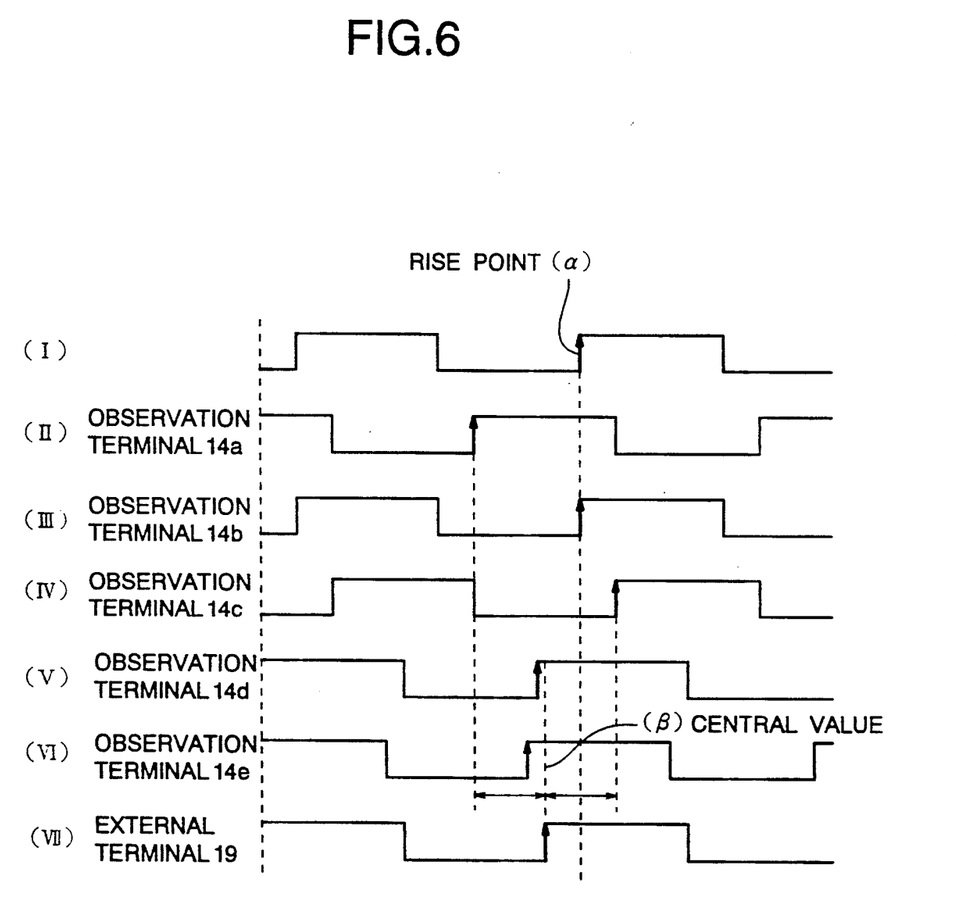
FIG. 6 is a timing chart to show the clock signal statuses observed at the observation terminals of logic circuit IC chips and the clock signal observed at the external terminal.
Figure 7:
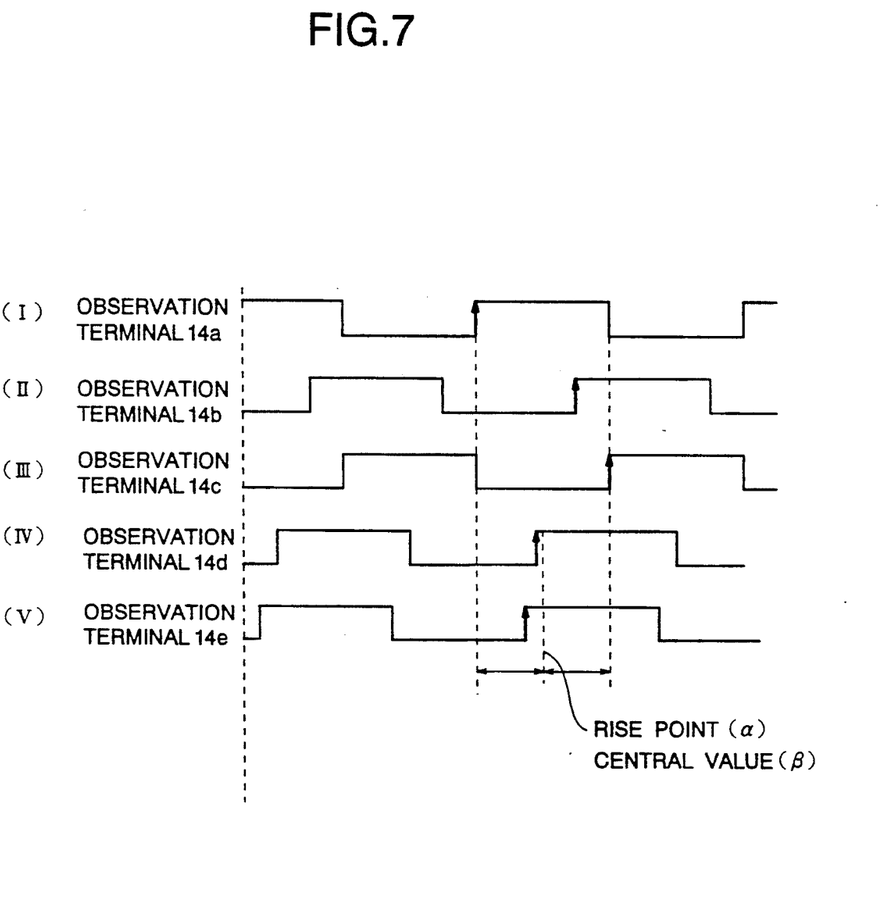
FIG. 7 is a timing chart to show the status where the rise of the clock signal of a logic circuit board is made identical to the rise point of the reference logic circuit board.

First, referring to the timing charts in FIGS. 6 and 7, the operation to adjust the logic circuit board 10A mounted onto the logic circuit board 100 as above is described.

In FIG. 6, (I) represents the clock signal supplied to the reference logic circuit board 110. Having the rise point (α) of the clock signal (I) as the reference, the clock signal data are taken at the observation terminals 14A to 14E on the logic circuit board 10A, so that the phase shifts of the clock signal at the logic circuit IC chips 12A to 12E are obtained. FIG. 6 (II) to (VI) show the clock signal statuses at the observation terminals 14A to 14E. The central value between the largest and the minimum phases is to be determined. For FIG. 6, the clock signal at the observation terminal 14A rises first, so this is the maximum phase value, the clock signal at the observation terminal 14C rises the last, so this is the minimum phase value. The central value (β) can be calculated therefrom.

Then, the phase of the clock signal is observed from the external terminal 19, and the propagation delay time given by the propagation time adjustment means 18 is adjusted so that the clock signal rises at the central value (β) obtained as above. The clock signal obtained from the external terminal 19 when the phase is adapted to the central value (β) is shown in FIG. 6 (VII).

The rise point of the clock signal at the external terminal 19 (identical to the central value (β)) has to be identical to the rise point (α) of the clock signal at the reference logic circuit board 110 above. To make the rise point (β) of the clock signal at the logic circuit board 10A identical to the rise point (α) at the reference logic circuit board 110, the original clock signal supplied from the clock supply board 120 is adjusted so that the clock signal supplied to the whole logic circuit board 10A is changed at a time. In other words, the rise of the original clock signal supplied from the clock supply board 120 to the logic circuit board 10A is shifted to the rise point (α) as the reference. Thus, as shown in FIG. 7, the rise point (β) of the clock signal for the logic circuit board 10A is made identical to the rise point (α) of the reference logic circuit board 110. This minimizes clock skew between the reference logic circuit board 110 and the logic circuit board 10A as in FIG. 7.

After similar adjustments for the remaining logic circuit boards 10B and 10C, either of the logic circuit boards shows, when observed at the external terminal 19, the central value of the phase shifts at a plurality of clock signals supplied to the logic circuit IC chips on that logic circuit board. Therefore, if a number of logic circuit boards according to this embodiment are used to constitute a logic circuit device 100, the clock skew among the logic circuit boards in the device can be minimized. This eliminates the need to give a large clock cycle for the whole device consisting of many logic circuit boards, which leads to an improved performance of the device.

Figure 8:
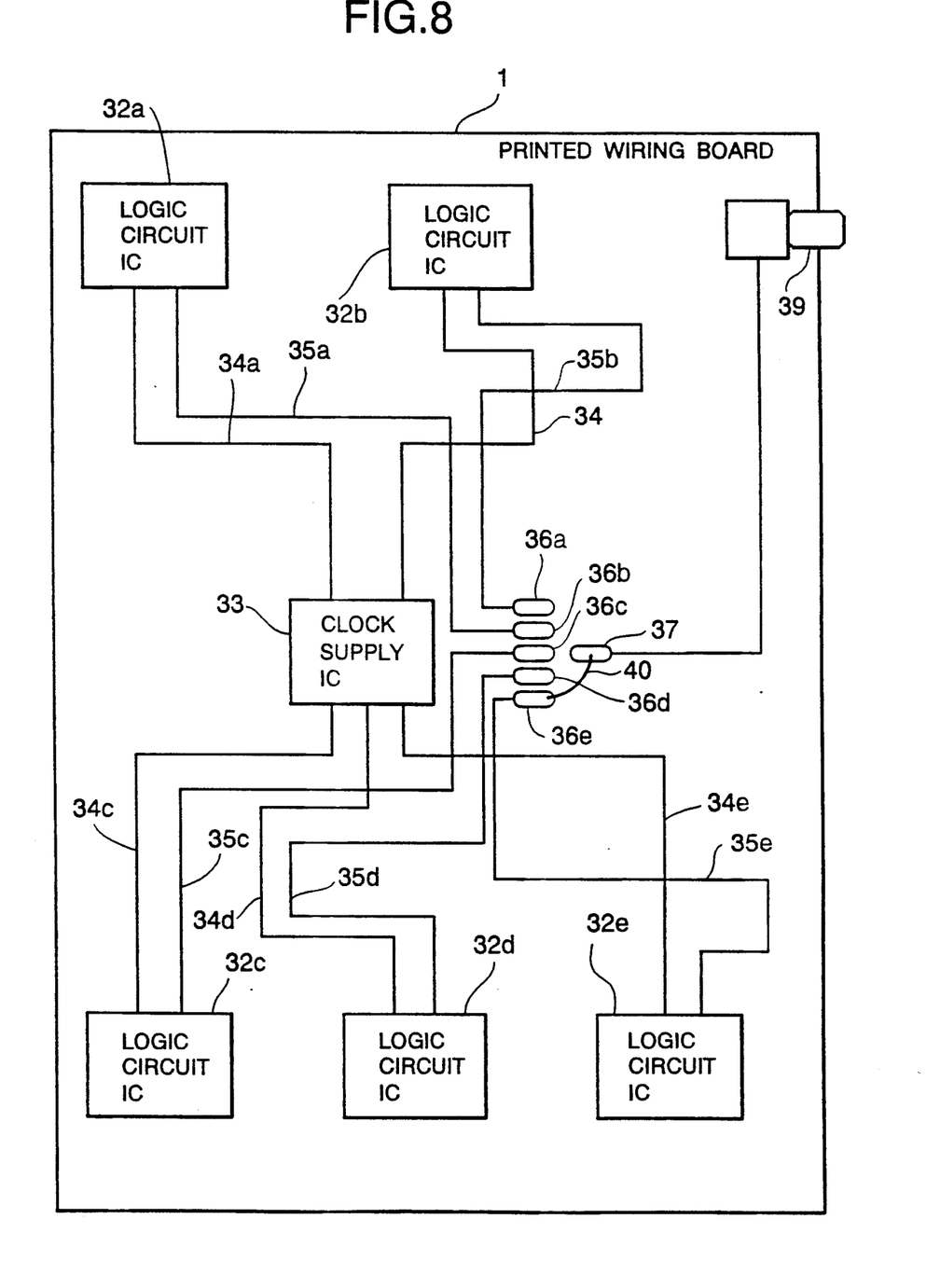
FIG. 8 is a schematic diagram to show the configuration of a logic circuit board provided with a clock observation circuit according to a second embodiment of the present invention.

FIG. 8 shows the configuration of a logic circuit board having clock observation function according to a second embodiment of the present invention.

In this embodiment, the logic circuit board comprises a printed wiring board 1 and a clock supply IC chip 33 and logic circuit IC chips 32A to 32E mounted thereon in the same disposition as the embodiment shown in FIG. 1. The logic circuit IC chips 32A to 32E receiving clock from the clock supply IC chip 33 are connected with the clock supply IC chip 33 via clock supply wires 34A to 34E, all of which have the same length.

In the vicinity of the clock supply IC ship 33 of the logic circuit board, observation terminals 36A to 36E are provided for observation of clock signals supplied to the logic circuit IC chips 32A to 32E. These observation terminals 36A to 36E are closely disposed in a row. The observation terminals 36A to 36E are respectively connected with the logic circuit IC chips 32A to 32E via wires 35A to 35E having the same length.

The printed wiring board 1 is provided with a relay terminal 37 for clock observation in the vicinity of the observation terminals 36A to 36E, and with an external terminal 39 for observation of the clock signal at the clock supply IC chip 33 on the border of the board 1. This external terminal 39 comprises a coaxial connector and is connected with the relay terminal 37 via a wire 38.

Next, the operation for adjusting the clock signal when logic circuit boards are mounted onto a logic circuit device 100 as shown in FIG. 5 is described. In this case, too, the device is provided with a reference logic circuit board 110 and a clock supply board 120.

Figure 9:
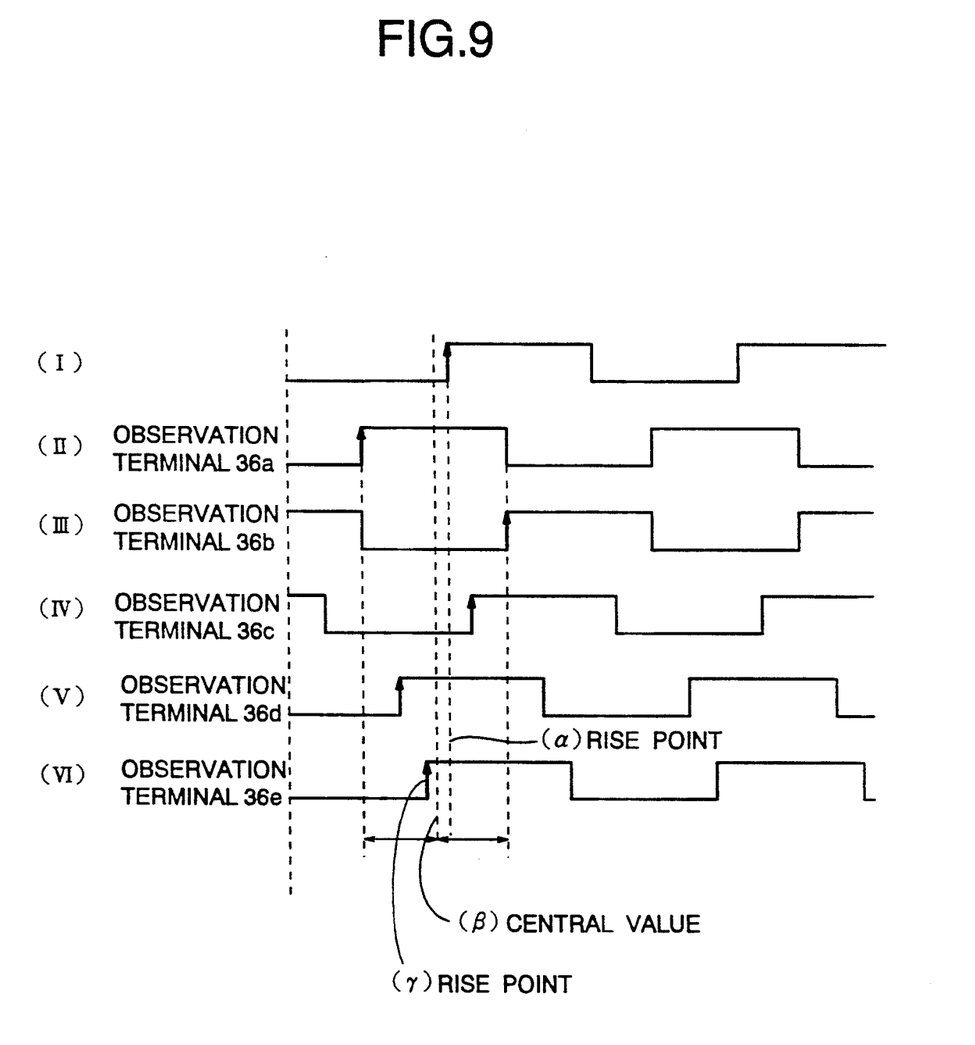
FIG. 9 is a timing chart to show the clock signal statuses observed at the observation terminals of logic circuit IC chips on a logic circuit board provided with a clock observation circuit according to a second embodiment.

In FIG. 9, (I) represents the clock signal supplied to the reference logic circuit board 110. Having the rise point (α) of the clock signal (I) as the reference, the clock signal data are taken at the observation terminals 34A to 34E on the logic circuit board. FIG. 9 (II) to (VI) show the clock signal statuses at the observation terminals 34A to 34E. Then, the observation terminal which has the clock phase rising at a point closest to the central value between the maximum and minimum phases learned from above data and the relay terminal 37 for clock observation are connected with a wire 40. In FIG. 9 (VI), according to measurement results, the clock signal at the observation terminal 36E rises at a point closest to the central value (β) between the maximum and the minimum phases. Thus, the phase of the clock signal obtained at the external terminal 39 is the clock phase at the observation terminal 36E.

After the clock phase at the external terminal 39 is determined, as in the first embodiment, the rise point (γ) of the clock signal at the external terminal 39 (closest to the central value (β)) has to be made identical to the rise point (α) of the clock signal at the reference logic circuit board 110 above. This embodiment can also minimize the clock skew between the reference logic circuit board 110 and the logic circuit board 10A.

In the second embodiment, the clock phase of the external terminal 39 is not set at the true central value for the observation terminals 34A to 34E, and the clock skew is a little larger than for the first embodiment. However, since the clock signals at the logic circuit IC chips 32A to 32E are output as they are to the external terminal 39, the clock signal can be adjusted taking change in clock skew due to temperature fluctuation into account. In the first embodiment, on the other hand, temperature fluctuation will cause a larger error since the clock skew differently changes for the logic circuit IC chips 12A to 12E and the propagation time adjustment means 18.

While the invention has been described in its preferred embodiments, it is to be understood that various modifications may be made therein. For example, five logic circuit IC chips are mounted in the above embodiments, but any number of such IC chips can be used. It is intended to cover in the appended claims all such modifications as fall within the true spirit and scope of the invention.

What is claimed is:

1. A logic circuit board with a clock observation circuit comprises;
   a plurality of logic circuit IC chips and a clock supply IC chip to supply a clock signal to said logic circuit IC chips mounted on a printed wiring board;
   said clock supply IC chip being connected with the logic circuit IC chips via clock supply wires which have the same length and are capable of propagating the clock signal;
   said logic circuit IC chips being respectively provided with an observation terminal for clock signal observation;
   said clock supply IC chip being provided with an external terminal for clock signal observation; and
   said clock supply IC chip and said external terminal being further provided with propagation time adjustment means between them.

2. A logic circuit board with a clock observation circuit of claim 1, wherein said external terminal is disposed on the border of said printed wiring board.

3. A logic circuit board with a clock observation circuit of claim 1, wherein said propagation time adjustment means adjusts the delay in propagation time for said clock signal so that the phase shift of the clock signal observed at said external terminal is identical to the central value of the maximum and the minimum phase shifts in the clock signal observed at the observation terminals of the logic circuit IC chips.

4. A logic circuit board with a clock observation circuit of claim 3, wherein said propagation time adjustment means comprises a delay circuit which uses a coil.

5. A logic circuit board with a clock observation circuit comprises;
   a plurality of logic circuit IC chips and a clock supply IC chip to supply a clock signal to said logic circuit IC chips mounted on a printed wiring board;
   said clock supply IC chip being connected with the logic circuit IC chips via cock supply wires which have the same length and are capable of propagating the clock signal;

said logic circuit IC chips being respectively provided with an observation terminal for observation of said clock signal supplied to the logic circuit IC chip;

said logic circuit IC chips and said corresponding observation terminals being connected via wires having the same length;

said printed wiring board being provided on its border with an external terminal for clock signal observation; and said observation terminals being provided a relay terminal which is connected with said external terminal and any of said observation terminals.

6. A logic circuit board with clock observation function of claim 5 wherein, said observation terminals are closely disposed in the vicinity of said relay terminal.

7. A logic circuit board with clock observation function of claim 5, wherein an observation terminal having a phase shift closest to the central value between the maximum and the minimum shifts of the clock signals observed at said observation terminals is selected and said selected observation terminal is connected with said relay terminal.

* * * * *